US010249923B2

(12) United States Patent
Gai et al.

(10) Patent No.: US 10,249,923 B2
(45) Date of Patent: Apr. 2, 2019

(54) ULTRA WIDE BAND FIXED PHASE SHIFTER BASED ON CAPACITIVE LOAD AND HAVING N PHYSICALLY SEPARATED PHASE SHIFT UNITS WITH ORTHOCOUPLERS THEREIN

(71) Applicant: NANJING MILEWEI CORP., Nanjing, Jiangsu (CN)

(72) Inventors: Chuan Gai, Jiangsu (CN); Dong Xia, Jiangsu (CN)

(73) Assignee: NANJING MILEWEI CORP., Nanjing, Jiangsu (CN)

( * ) Notice: Subject to any disclaimer, the term of this patent is extended or adjusted under 35 U.S.C. 154(b) by 55 days.

(21) Appl. No.: 15/511,713

(22) PCT Filed: Aug. 5, 2016

(86) PCT No.: PCT/CN2016/093395
§ 371 (c)(1),
(2) Date: Mar. 16, 2017

(87) PCT Pub. No.: WO2017/128678
PCT Pub. Date: Aug. 3, 2017

(65) Prior Publication Data
US 2018/0233794 A1    Aug. 16, 2018

(30) Foreign Application Priority Data
Jan. 27, 2016    (CN) .......................... 2016 1 0055861.9

(51) Int. Cl.
*H01P 1/185* (2006.01)
*H01P 1/18* (2006.01)
(Continued)

(52) U.S. Cl.
CPC ............... *H01P 1/185* (2013.01); *H01P 1/18* (2013.01); *H01P 1/184* (2013.01);
(Continued)

(58) Field of Classification Search
CPC ............... H01P 1/185; H01P 1/18; H01P 9/00
(Continued)

(56) References Cited

U.S. PATENT DOCUMENTS 6,496,147 B1 * 12/2002 Kirino ...................... H01Q 3/26
                                                         333/156
7,015,773 B2 *  3/2006 Chiang et al. .......... H01P 1/185
                                                         333/109
(Continued)

FOREIGN PATENT DOCUMENTS

CN    101192819    6/2008
CN    102176523    9/2011
(Continued)

OTHER PUBLICATIONS

International Search Report filed in PCT/CN2016/093395 dated Oct. 26, 2016.

*Primary Examiner* — Benny T Lee
(74) *Attorney, Agent, or Firm* — Rankin, Hill & Clark LLP

(57) ABSTRACT

The present invention discloses an ultra wide band fixed phase shifter based on a capacitive load, which includes N physically separated phase shift units, and each phase shift unit includes an orthocoupler, first and second transmission lines, and first and second capacitive loads, wherein the orthocoupler includes an input end, a coupling end, a direct-connection end and an isolation end, one end of the first transmission line serves as a signal input end of the phase shift unit and the other end is connected with the input end of the orthocoupler, one end of the second transmission line serves as a signal output end of the phase shift unit and the other end is connected with the isolation end of the orthocoupler; one end of the first capacitive load is connected with the coupling end of the orthocoupler and the other end is grounded; one end of the second capacitive load
(Continued)

is connected with the direct-connection end of the orthocoupler and the other end is grounded. The ultra wide band fixed phase shifter based on a capacitive load has compact structure, small area occupation and small insertion loss, does not need extra power supply and logical control, and can be widely applied.

4 Claims, 5 Drawing Sheets

(51) Int. Cl.
| | |
|---|---|
| *H03H 7/01* | (2006.01) |
| *H03H 7/20* | (2006.01) |
| *H03H 7/21* | (2006.01) |
| *H03H 7/18* | (2006.01) |
| *H03H 7/19* | (2006.01) |
| *H01P 5/18* | (2006.01) |

(52) U.S. Cl.
CPC .......... *H03H 7/1708* (2013.01); *H03H 7/185* (2013.01); *H03H 7/19* (2013.01); *H03H 7/20* (2013.01); *H03H 7/21* (2013.01); *H01P 5/184* (2013.01)

(58) Field of Classification Search
USPC .......................................................... 333/164
See application file for complete search history.

(56) References Cited

U.S. PATENT DOCUMENTS

| | | | |
|---|---|---|---|
| 8,704,575 B2 | 4/2014 | Hur et al. | |
| 2005/0122253 A1* | 6/2005 | Steinbuch | H01P 1/185 |
| | | | 342/169 |

FOREIGN PATENT DOCUMENTS

| | | |
|---|---|---|
| CN | 102820868 | 12/2012 |
| CN | 105514539 | 4/2016 |

\* cited by examiner

ULTRA WIDE BAND FIXED PHASE SHIFTER BASED ON CAPACITIVE LOAD AND HAVING N PHYSICALLY SEPARATED PHASE SHIFT UNITS WITH ORTHOCOUPLERS THEREIN

TECHNICAL FIELD

The present invention relates to a phase shifter, and more particularly, to an ultra wide band fixed phase shifter.

BACKGROUND

With the continuous development of broadband active phased array radar, the demand for antenna beam control has been increasing, and the research on control circuit has been deepened.

As a key device for beam control, a phase shifter is always one of the key devices in an antenna transceiver module because the phase shifter has more working states, a large area occupation, high performance requirements, and is associated with a high difficulty of design and manufacture. The development of the phased array radar has raised higher requirements on the bandwidth, phase-shifting accuracy and integrated area of the phase shifter, and other aspects. Therefore, it has great significance and practical value in researching broadband and ultra wide band high-performance phase shifters.

However, there are always some non-ideal factors or difficulties while actually using the phase shifter in a communication system. For example, in an actual multi channel system (such as a phased array), the phases in each channel are not consistent and have some differences due to the length difference of access transmission lines, length difference of gold bonding wires and phase characteristic difference of the chip itself during board distribution. Therefore, it is very necessary to develop a wideband fixed phase shifter which is easy for system debugging and can amend wideband system phases.

SUMMARY OF THE INVENTION

Object of the Present Invention in order to solve the defects in the related art, the patent provides an ultra wide band digital phase shifter, ultra wide band fixed phase shifter based on a capacitive load.

Technical Solutions

In Order to Solve the Foregoing Technical Problems, the Ultra Wide Band fixed phase shifter based on a capacitive load provided by the present invention includes:

N physically separated phase shift units, (N−1) phase shift states being implemented by accessing signal input ends and signal output ends of different phase shift units.

Each phase shift unit includes an orthocoupler, first and second transmission lines, and first and second capacitive loads, wherein the orthocoupler includes an input end, a coupling end, a direct-connection end and an isolation end, one end of the first transmission line serves as a signal input end of the phase shift unit and the other end is connected with the input end of the orthocoupler, one end of the second transmission line serves as a signal output end of the phase shift unit and the other end is connected with the isolation end of the orthocoupler; one end of the first capacitive load is connected with the coupling end of the orthocoupler and the other end is grounded; one end of the second capacitive load is connected with the direct-connection end of the orthocoupler and the other end is grounded.

Preferably, the first and second capacitive loads respectively connected with the coupling end and the direct-connection end of the orthocoupler in each phase shift unit are pure capacity cells. Preferably, the characteristic resistances of the first and second transmission lines respectively connected with the input end and the isolation end of the orthocoupler are both 50 ohm.

Preferably, orthocouplers adopted in the N phase shift units are completely identical.

Further preferably, the orthocoupler is an ultra wide band orthocoupler cascaded by spiral inductor coupling units; each stage of spiral inductor coupling unit includes two spiral inductors coupled mutually; two adjacent stages of spiral inductor coupling units are respectively connected in series with one of the two spiral inductors in a post-stage of spiral inductor coupling unit through the two spiral inductors in a prior-stage of spiral inductor coupling unit to implement prior-post stage cascade.

One end of one spiral inductor cascaded in the first stage of spiral inductor coupling unit in the orthocoupler and located outside the orthocoupler is the coupling end of the orthocoupler and one end of the other spiral inductor located outside the orthocoupler is the input end of the orthocoupler; one end of one spiral inductor cascaded in the last stage of spiral inductor coupling unit in the orthocoupler and located outside the orthocoupler is the direct-connection end of the orthocoupler and one end of the other spiral inductor located outside the orthocoupler is the isolation end of the orthocoupler.

The coupling interval or microstrip band width of each spiral inductor coupling unit in the orthocoupler from the exterior to the interior decreases gradually.

Further preferably, the spiral inductor coupling units are mutually coupled by locating the two spiral inductors thereof at the same layer of metal and using marginal coupling, or the spiral inductor coupling units are mutually coupled by locating the two spiral inductors thereof at different layers of metals and using marginal coupling and upper-lower layer coupling.

Further preferably, a bridging capacitor is bridged between ports of the two spiral inductors of each spiral inductor coupling unit located at the same side, and the two ends of the bridging capacitor are respectively grounded through a ground capacitor.

Preferably, a circuit structure of the orthocoupler is in bilateral symmetry and longitudinal symmetry, and all the elements are lumped elements.

Advantageous Effects the ultra wide band fixed phase shifter based on a capacitive load provided by the present invention has the following advantages.

1. The use of the capacitive load avoids the use of a large-size spiral inductor in a conventional load of capacitor inductor series/parallel form, decreases the circuit size, and reduces the cost; on the other hand, extra loss for introducing spiral inductors in a conventional structure is avoided, so that the entire insertion loss of the phase shifter is smaller.

2. In the circuit of each phase shift unit, different phase shift values can be obtained by adjusting the capacitance values of the first and second capacitive loads and adjusting the lengths of the first and second transmission lines after finishing the circuit design of the orthocoupler, thus greatly simplifying the design of the phase shifter. Further, completely identical orthocouplers can be adopted in the present invention as core circuits of the phase shifter, to further simplify the design of the phase shifter.

3. The capacitive loads will not exacerbate the bandwidth of the phase shifter, i.e., the working bandwidth of the phase shifter is mainly determined by the working bandwidth of the orthocoupler.

4. A plurality of phase shift unit circuits are included, so that power supply and logical control circuits are not needed, and phases in a system channel can be amended by selecting different phase shift unit circuits, which is very easy to use in system debugging.

5. Further, the ultra wide band orthocoupler cascaded by spiral coupling inductors matched and adopted in the phase shift unit circuit enables to keep an excellent phase flatness within the bandwidth scope of the orthocoupler and obtain more excellent ultra wide band phase shift performance.

Generally speaking, the ultra wide band fixed phase shifter based on a capacitive load provided by the present invention has compact structure, simple design method and small insertion loss, does not need extra power supply and logical control, and can be widely applied to wideband active phased array radar system debugging.

DETAILED DESCRIPTION OF THE INVENTION

The present invention will be further explained in details with reference to the embodiments and the accompanying drawings, but the following embodiments will not constitute to any limitation to the present invention.

Figure 1:
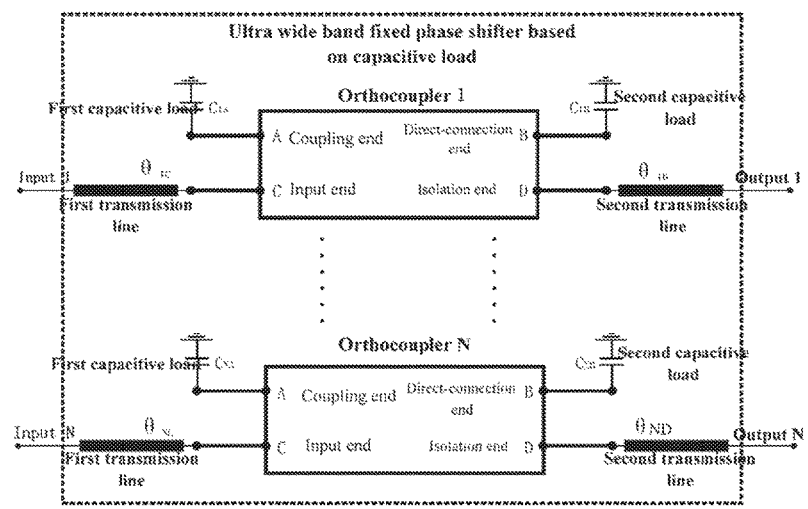
FIG. 1 is a principle block diagram of an ultra wide band fixed phase shifter based on a capacitive load provided by the present invention as embodiment 1.

An ultra wide band fixed phase shifter based on a capacitive load provided by the embodiment of the present invention can implement wider working bandwidth using a smaller circuit area, and has excellent phase shift stability. As shown in FIG. 1, the ultra wide band fixed phase shifter based on a capacitive load provided by the present invention includes N phase shift units, wherein the N phase shift units are physically separated and physically switch different phase shift units by accessing signal input ends and signal output ends of different phase shift units. (N−1) phase shift states can be implemented, wherein N is no less than 2. An $N^{th}$ phase shift unit is taken as an example, wherein an orthocoupler N, a first transmission line $\theta_{NC}$, a second transmission line $\theta_{ND}$, a first capacitive load $C_{NA}$ and a second capacitive load $C_{NB}$ are included. The orthocoupler includes an input end C, a coupling end A, a direct-connection end B and an isolation end D, one end of the first transmission line $\theta_{NC}$ serves as a signal input end of the phase shift unit and is used as an input N for receiving an input signal, and the other end of the first transmission line $\theta_{NC}$ is connected with the input end C of the orthocoupler, one end of the second transmission line $\theta_{ND}$ serves as a signal output end of the phase shift unit and is used as an output N for outputting an output signal, and the other end of the second transmission line $_{ND}$ is connected with the isolation end D of the orthocoupler; one end of the first capacitive load $C_{NA}$ is connected with the coupling end A of the orthocoupler and the other end is grounded; one end of the second capacitive load $C_{NB}$ is connected with the direct-connection end B of the orthocoupler and the other end is grounded. That is, the coupling end of the orthocoupler is grounded through the first capacitive load $C_{NA}$, and the direct-connection end of the orthocoupler is grounded through the second capacitive load $C_{NB}$.

Orthocouplers (Orthocoupler 1 . . . Orthocoupler N) adopted in the phase shift units above can be completely identical.

Embodiment 1

FIG. 1 shows a principle block diagram of an ultra wide band fixed phase shifter including N phase shift units provided by the present invention, wherein N is no less than 2. The principle simulation of the ultra wide band fixed phase shifter based on a capacitive load provided by the embodiment is as follows:

An ultra wide band fixed phase shifter including four phase shift units when N=4 is taken as an example for simulation, wherein any frequency of the orthocoupler adopted for simulation is ideal response, i.e., the amplitudes of the output end and the coupling end are equal, and the phase difference is 90 degrees; and the isolation end is completely isolated. An ideal capacity cell (infinite quality factor) is adopted as the capacitive load, and the transmission line is an ideal transmission line having a characteristic impedance of 50 ohm. The specific circuit parameters are as shown in Table 1.

TABLE 1

| Circuit parameters of four ideal fixed phase shifters (capacity: pF, and electrical length: deg@30 GHz) | | | | | | | |
|---|---|---|---|---|---|---|---|
| 0.3 | 0.3 | 0 | 0 | 0.47 | 0.47 | 8.95 | 8.95 |
| 0.6 | 0.6 | 13.9 | 13.9 | 0.79 | 0.79 | 19.4 | 19.4 |

Figure 2:
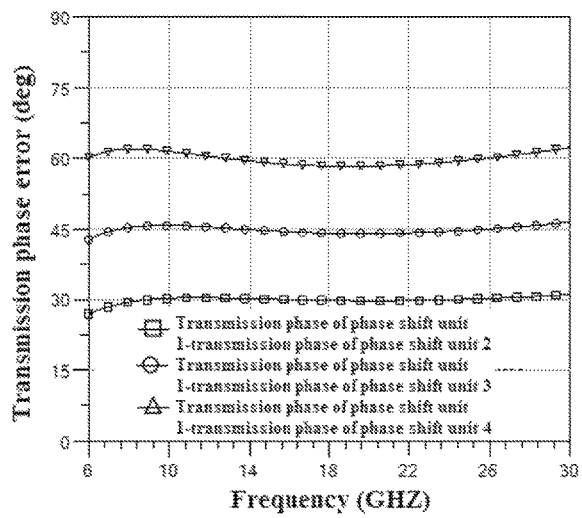
FIG. 2 is a phase shift emulation result under 30-degree, 45-degree and 60-degree phase shifts provided by four ultra wide band fixed phase shifters composed of ideal devices illustrated in embodiment 1.

The phase shift character simulation results of the above-mentioned four ideal fixed shifters are as shown in FIG. 2, wherein 30-degree, 45-degree and 60-degree phase shifts are implemented within a 5-30 GHz frequency scope, shown in a transmission phase error (y-axis, degrees) versus frequency (x-axis, GHz) graph (e.g., transmission phase of phase shift unit 1-transmission phase of phase shift unit 2, transmission phase of phase shift unit 1-transmission phase of phase shift unit 3, transmission phase of phase shift unit 1-transmission phase of phase shift unit 4). Because ideal devices are adopted for simulation, the transmission characteristic and echoing characteristic thereof are ideal; moreover, the transmission coefficient is equal to 1, and a standing-wave ratio is equal to 1. The simulation test of the above ideal devices proves that the structure can implement minor phase shift fluctuation within sextuple frequency intervals in principle.

Embodiment 2

In practical application, multiple implementation methods for the orthocoupler are adopted in the present invention, for example, a quadrature hybrid, a directional coupler based on a distributed coupling transmission line, or a lumped coupler that implements distributed effects through lumped elements. The embodiment 2 provides an ultra wide band fixed phase shifter based on a capacitive load, wherein the structure of the phase shift unit thereof is consistent with the foregoing structure description, and will not be elaborated, and the orthocoupler adopted thereof is an ultra wide band orthocoupler cascaded by spiral inductor coupling units. The orthocoupler has the advantages of miniaturization, low insertion loss, and high isolation.

Figure 3:
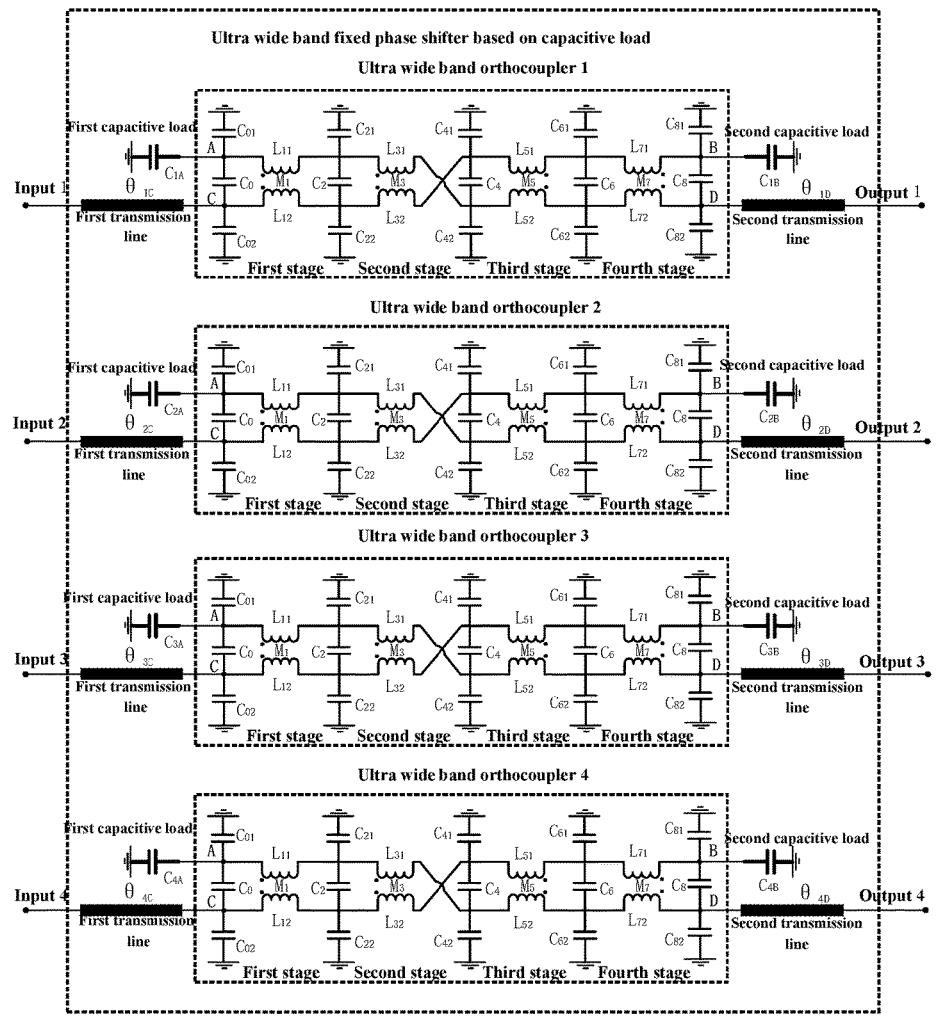
FIG. 3 is a structure block diagram of four ultra wide band fixed phase shifters provided as embodiment 2.

FIG. 3 shows a structure block diagram of an ultra wide band fixed phase shifter including four phase shift unit circuits (e.g., ultra wide band orthocoupler 1, ultra wide band orthocoupler 2, ultra wide band orthocoupler 3, and ultra wide band orthocoupler 4, each associated with a coupling end A, an input end C, a direct-connection end B, and an isolation end D) provided by the embodiment 2. The ultra wide band fixed phase shifter based on a capacitive load provided by the embodiment 2 can implement three phase shift states. The structures of the four phase shift units respectively corresponding to N=1, 2, 3, 4 are consistent with the structure description of the foregoing phase shift units, and will not be elaborated.

As shown in FIG. 3, the ultra wide band orthocoupler adopted in the embodiment 2 is implemented by lumped elements like inductor coupling units, circuits and coupling capacitors, so as to reduce the circuit size; in order to increase the working bandwidth of the orthocoupler, the ultra wide band orthocoupler is cascaded by multistage spiral inductor coupling units, and each stage of spiral inductor coupling unit includes two spiral inductors coupled mutually. In order to increase the working bandwidth of the orthocoupler in the employment 2, the ultra wide band orthocoupler in each phase shift unit is cascaded by four spiral inductor coupling units, and the detailed description of the ultra wide band orthocoupler further provided by the present invention is introduced herein by taking this embodiment as an example.

As shown in FIG. 3, the spiral inductor coupling units have the same circuit structures, wherein the first stage of spiral inductor coupling unit of a wideband coupler 1 in a first phase shift unit is taken as an example to explain. A first spiral inductor L11 and a second spiral inductor L12 mutually coupled in this circuit are included, wherein a bridging capacitor C0 is bridged between the ports of the first and second spiral inductors located at the left side, a bridging capacitor C2 is bridged between the ports of the first and second spiral inductors located at the right side, the two ends of the bridging capacitor C0 are respectively grounded through ground capacitors C01 and C02, and the two ends of the bridging capacitor C2 are respectively grounded through ground capacitors C21 and C22. The two spiral inductors tightly coupled up and down (e.g., around a core) provide inductor coupling. In the spiral inductor coupling units, mutual coupling is implemented by locating the two spiral inductors thereof on the same layer of metal and using marginal coupling, or mutual coupling is implemented by locating the two spiral inductors thereof on different layers of metals and using marginal coupling and upper-lower layer coupling. The four ground capacitors C01, C02, C21, and C22, and the bridging capacitors C0 and C2 between the two spiral inductors are used for providing proper odd and even mode impedance to implement a coupling function together.

Each spiral inductor coupling unit is connected with a right port of a prior-stage of unit through a left port of a post-stage of unit to implement multistage cascade. Two adjacent stages of spiral inductor coupling units are respectively connected in series with one of the two spiral inductors in a post-stage of spiral inductor coupling unit through the two spiral inductors in a prior-stage of spiral inductor coupling unit to implement prior-post stage cascade. To be specific, the adjacent stages of spiral inductor coupling units implement prior-post stage cascade by connecting the first spiral inductor in the prior-stage with the first spiral inductor in the post-stage in series and connecting the second spiral inductor in the prior-stage with the second spiral inductor in the post-stage in series, or the adjacent stages of spiral inductor coupling units implement prior-post stage cascade by connecting the first spiral inductor in the prior-stage with the second spiral inductor in the post-stage in series and connecting the second spiral inductor in the prior-stage with the first spiral inductor in the post-stage in series. The circuits of the prior-stage of spiral inductor coupling units and the post-stage of spiral inductor coupling units are merged and share the bridging capacitors and the ground capacitors at the two ends thereof.

To simplify the circuit design, a circuit structure of the orthocoupler is in bilateral symmetry and longitudinal symmetry, i.e.: C01=C02=C81=C82; C21=C22=C61=C62; C41=C42; C0=C8; C2=C6; L11=L12=L71=L72; and L31=L32=L51=L52. Moreover, M1, M3, M5 and M7 represent coupling factors of two spiral inductors tightly coupled in the first stage of spiral inductor coupling unit, the second stage of spiral inductor coupling unit, the third stage of spiral inductor coupling unit and the fourth stage of spiral inductor coupling unit respectively; due to the structural symmetry of the circuit, M1=M7, and M3=M5.

One end of one spiral inductor cascaded in the first stage of spiral inductor coupling unit in the orthocoupler and located outside the orthocoupler is the coupling end of the orthocoupler and one end of the other spiral inductor located outside the orthocoupler is the input end of the orthocoupler; one end of one spiral inductor cascaded in the last stage of spiral inductor coupling unit in the orthocoupler and located outside the orthocoupler is the direct-connection end of the orthocoupler and one end of the other spiral inductor located outside the orthocoupler is the isolation end of the orthocoupler; to be specific, an upper-left port and a lower-left port of the first stage of inductor coupling unit in each orthocoupler of the embodiment are a coupling end A and an input end C (e.g., associated with Input 1, Input 2, Input 3, and Input 4, for ultra wide band orthocoupler 1, ultra wide band orthocoupler 2, ultra wide band orthocoupler 3, and ultra wide band orthocoupler 4, respectively) of the orthocoupler respectively; and an upper-left port and a lower-right port of the last stage of inductor coupling unit are a direct-connection end B and an isolation end D (e.g., associated with Output 1, Output 2, Output 3, and Output 4, for ultra wide band orthocoupler 1, ultra wide band orthocoupler 2, ultra wide band orthocoupler 3, and ultra wide band orthocoupler 4, respectively) of the orthocoupler.

Meanwhile, two spiral inductors mutually coupled in the two spiral inductor coupling units located outside of the orthocoupler according to the example, i.e., the first stage of spiral inductor coupling unit and the fourth stage of spiral inductor coupling unit, have larger intervals and smaller coupling factors; however, the two spiral inductors mutually coupled in the two spiral inductor coupling units relatively located in the center, i.e., the second stage of spiral inductor coupling unit and the third spiral inductor coupling unit have smaller intervals, and implement close coupling; therefore, M1=M7<M3=M5. According to the orthocoupler structure, the coupling intervals of each spiral inductor coupling unit in the orthocoupler from the exterior to the interior decreases gradually, which implements gradual change of the coupling factor from the exterior to the interior, thus implementing ultra wide band coupling of the orthocoupler.

Certainly, the foregoing embodiment is only illustration of the present invention, and various forms of orthocouplers can be adopted in the ultra wide band fixed phase shifter based on a capacitive load in the present invention. When the ultra wide band orthocoupler further provided by the present invention is adopted, the ultra wide band orthocoupler is cascaded by multistage spiral inductor coupling units greater than 2 according to the actual requirements, for instance, 2 stages, three stages, four stages, five stages, six stages, seven stages and even more. The coupling factors of each stage of spiral inductor coupling units can be changed gradually and adjustable from the exterior to the interior through the coupling intervals or microstrip band widths of two spiral inductors mutually coupled thereof. In the ultra wide band orthocoupler further provided by the present invention, the coupling intervals or microstrip band widths of each spiral inductor coupling unit in the orthocoupler from the exterior to the interior decreases gradually.

In the structure provided by the present invention, and under the condition of setting all the reference impedances to be 50 ohm, the coupling intervals and capacitor's capacity of each spiral inductor coupling unit are optimized through electromagnetic simulation, so that an ultra wide working band required can be obtained; moreover, radio frequencies/microwave signal frequencies outputted by the direct-connection end and the coupling end are the same as that of input signals, to implement 3 dB power equal dividing. On the aspect of phase, an output signal of the direct-connection end and an output signal of the coupling end differ by 90 degrees, which implements a structure for transforming between a single-ended signal and an orthogonal signal.

Certainly, the foregoing embodiment is only an illustration of the implementation of the ultra wide band orthocoupler provided by the present invention, and the foregoing embodiment will not constitute to any limitation to the present invention.

As shown in FIG. 1, the first capacitive load $C_{1A}$ and the second capacitive load $C_{1B}$ in the ultra wide band fixed phase shifter are respectively connected with the coupling end A and the direct-connection end B of the orthocoupler. Similarly, in FIG. 3, the first capacitive load $C_{1A}$ and the second capacitive load $C_{1B}$ in the ultra wide band fixed phase shifter are respectively connected with the coupling end A and the direct-connection end B of the orthocoupler 1. Also in FIG. 3, the first capacitive load $C_{2A}$ and the second capacitive load $C_{2B}$ in the ultra wide band fixed phase shifter are respectively connected with the coupling end A and the direct-connection end B of the orthocoupler 2, the first capacitive load $C_{3A}$ and the second capacitive load $C_{3B}$ in the ultra wide band fixed phase shifter are respectively connected with the coupling end A and the direct-connection end B of the orthocoupler 3, and the first capacitive load $C_{4A}$ and the second capacitive load $C_{4B}$ in the ultra wide band fixed phase shifter are respectively connected with the coupling end A and the direct-connection end B of the orthocoupler 4. Adopting pure capacity cells as loads for the direct-connection end and the coupling end of the orthocoupler avoids the use of inductance elements with lower quality, which not only saves the chip size, but also reduces the chip loss; moreover, adopting the pure capacity cells as loads will not exacerbate the bandwidth of the phase shifter, i.e., the bandwidth of the phase shifter is completely depended on the bandwidth of the orthocoupler. A traditional LC series parallel load has the defects of big size and high loss on one hand, and on the other hand, inductance and capacitance thereof are possibly difficult to select, or easy to limit the working bandwidth of the phase shifter.

As shown in FIG. 1, the first transmission line $\theta_{1C}$ and the second transmission line $\theta_{1D}$ in the ultra wide band fixed phase shifter are respectively connected with the input end C (e.g., as Input 1) and the isolation end D (e.g., as Output 1) of the orthocoupler. Similarly, in FIG. 3, the first transmission line $\theta_{1C}$ and the second transmission line $\theta_{1D}$ in the ultra wide band fixed phase shifter are respectively connected with the input end C (e.g., as Input 1) and the isolation end D (e.g., as Output 1) of the orthocoupler 1. Also in FIG. 3, the first transmission line $\theta_{2C}$ and the second transmission line $\theta_{2D}$ in the ultra wide band fixed phase shifter are respectively connected with the input end C (e.g., as Input 2) and the isolation end D (e.g., as Output 2) of the orthocoupler 2, the first transmission line $\theta_{3C}$ and the second transmission line $\theta_{3D}$ in the ultra wide band fixed phase shifter are respectively connected with the input end C (e.g., as Input 3) and the isolation end D (e.g., as Output 3) of the orthocoupler 3, and the first transmission line $\theta_{4C}$ and the second transmission line $\theta_{4D}$ in the ultra wide band fixed phase shifter are respectively connected with the input end C (e.g., as Input 4) and the isolation end D (e.g., as Output 4) of the orthocoupler 4. The major effects of the first and second transmission lines include: 1). cooperating to select the capacitance of the capacitive load, and adjusting the phases of the input end and the output end of the phase shifter together; and 2). the transmission lines can decrease the distances among the input ends (or output ends) of a plurality of phase shift unit circuits in the chip, so that the input end (or output end) of the phase shifter is more compact, and is convenient to bond in actual use.

After completing the design and selection of the orthocoupler of the present invention, the capacitance of the capacitive load in each phase shift unit circuit and the electrical length of the transmission line can be selected according to the actual requirements. The four phase shift units illustrated in the foregoing embodiment 2 are taken as examples to continuously explain, wherein all the transmission lines in the phase shift unit circuits are implemented using 50 ohm microstrip lines, and both the characteristic resistances of the first and second transmission lines are 50 ohm. The capacitive loads in the phase shift unit circuits are all implemented using MMIC capacitors. Usually, parameters in a reference phase shift unit circuit 1 are determined first. Preferably, to simplify the design complexity, the parameters are symmetrically selected, i.e., the electrical lengths of the first and second transmission lines in the reference circuit 1 can be selected optionally, and let herein. The following issues shall be taken into consideration while selecting the capacitive capacitance: 1). for a reference circuit, the capacitive capacitance is relatively smaller; and 2). smaller capacitance will cause larger phase reference deviation to the reference circuit due to the influence of working errors. In case of meeting the above-mentioned two conditions, the capacitance of the capacitive load of the reference circuit 1 can be selected optionally.

Subsequently, parameters in a non-reference phase shift unit circuit N are determined; a phase between the phase shift unit of the non-reference circuit and the phase shift unit of the reference circuit is obtained by increasing the capacitance and the electrical length, and an optimum value needs to be simulated and optimized.

Figure 4:
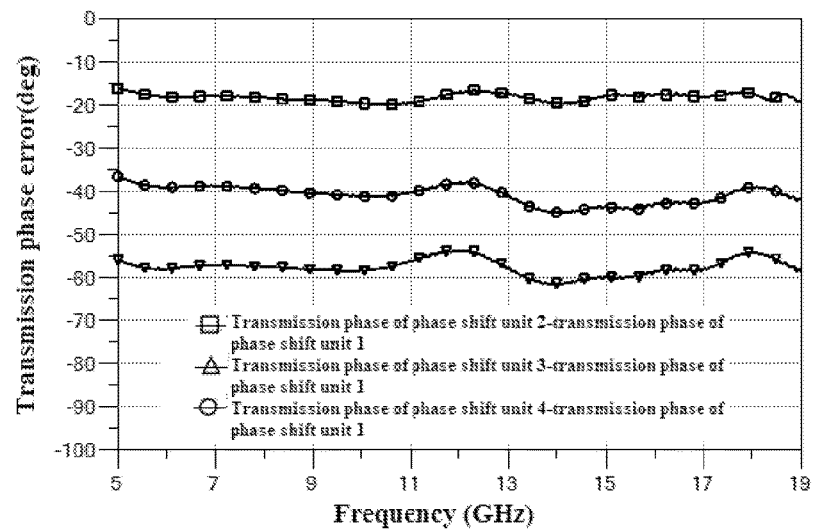
FIG. 4 is a phase shift test result under 20-degree, 40-degree and 60-degree phase shifts provided by the four ultra wide band fixed phase shifters provided by the embodiment 2.
Figure 5:
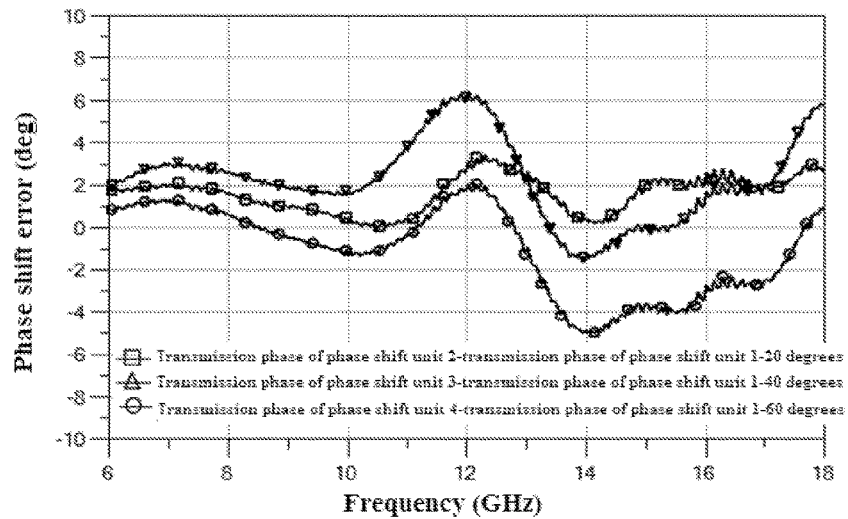
FIG. 5 is a phase shift error test result under 20-degree, 40-degree and 60-degree phase shifts provided by the four ultra wide band fixed phase shifters provided by the embodiment 2.
Figure 6:
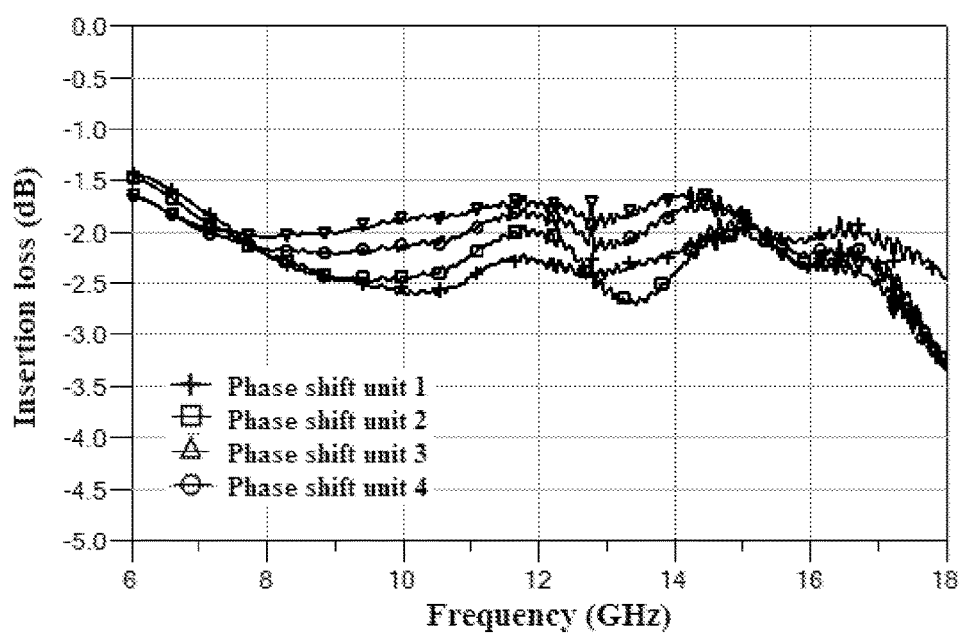
FIG. 6 is an insertion loss test result of the four ultra wide band fixed phase shifters provided by the embodiment 2.
Figure 7:
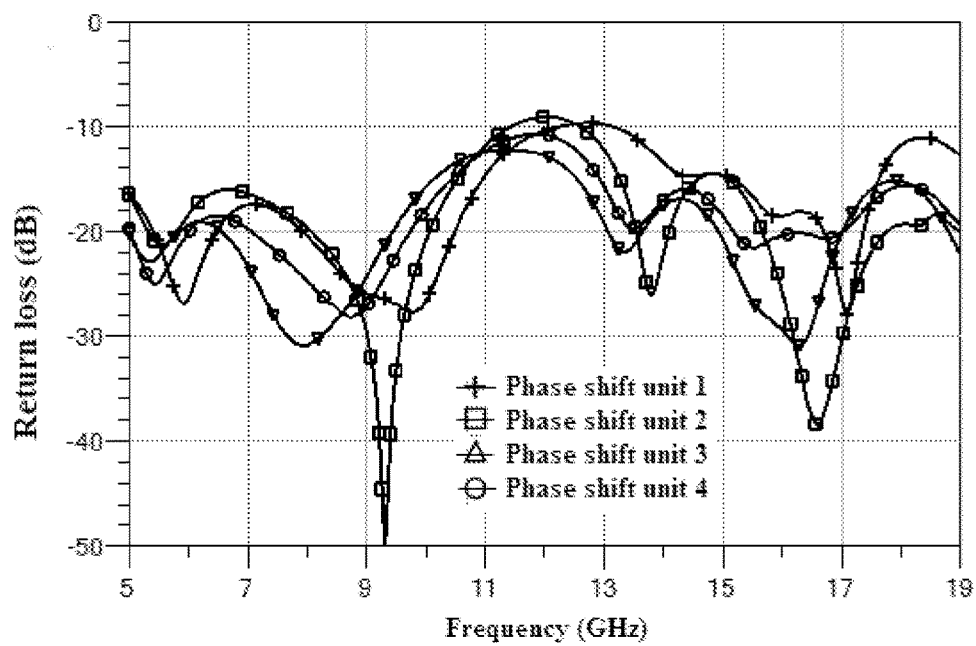
FIG. 7 is a return loss test result of the four ultra wide band fixed phase shifters provided by the embodiment 2.

Through actual measurement, when the ultra wide band orthocoupler is adopted, the performance of the ultra wide band fixed phase shifter based on a capacitive load provided by the present invention within a working bandwidth of 6-18 GHz required is as shown in FIGS. 4-7. As shown in FIG. 4, the four ultra wide band fixed phase shifters illustrated in the foregoing embodiment 2 can provide three phase shift states, which are respectively 20 degrees, 40 degrees and 60 degrees, shown in a transmission phase error (y-axis, degrees) versus frequency (x-axis, GHz) graph (e.g., transmission phase of phase shift unit 2-transmission phase of phase shift unit 1, transmission phase of phase shift unit 3-transmission phase of phase shift unit 1, transmission phase of phase shift unit 4-transmission phase of phase shift unit 1). As shown in FIG. 5, the wideband phase shift error change (in degrees) of the ultra wide band fixed phase shifter is smaller, and the precision thereof is higher, shown in a phase shift error (y-axis, degrees) versus frequency (x-axis, GHz) graph (e.g., transmission phase of phase shift unit 2-transmission phase of phase shift unit 1—20 degrees, transmission phase of phase shift unit 3-transmission phase of phase shift unit 1—40 degrees, transmission phase of phase shift unit 4-transmission phase of phase shift unit 1—60 degrees). As shown in FIG. 6, the insertion loss of the four phase shift units within a wideband scope of 6-18 GHz is less than 3.5 dB, which is less than the loss of a digital phase shifter, shown in an insertion loss (y-axis, dB) versus frequency (x-axis, GHz) graph (e.g., phase shift unit 1, phase shift unit 2, phase shift unit 3, phase shift unit 4). As shown in FIG. 7, the return loss characteristic of the ultra wide band fixed phase shifter is excellent, shown in a return loss (y-axis, dB) versus frequency (x-axis, GHz) graph (e.g., phase shift unit 1, phase shift unit 2, phase shift unit 3, phase shift unit 4).

In the present invention, different phase shift states can be obtained by changing the electrical length of the transmission lines and the capacitance of the load capacitor; therefore, the present invention is convenient to design, has excellent phase shift performances, and excellent amplitude consistency can be achieved. Moreover, completely identical designs can be adopted in the N phase shift units, to simplify the design. Further, the ultra wide band orthocoupler cascaded by spiral coupling inductors and provided by the present invention is cooperatively adopted in the phase shift unit circuit, which enables to keep an excellent phase flatness in the bandwidth scope of the orthocoupler, obtains more excellent ultra wide band phase shift performance, and has the advantages of miniaturization, low insertion loss and high isolation. Moreover, different from a traditional numerical control phase shifter, the design does not need extra power supply and logical circuits, and is very suitable for amending phases during debugging while producing multi channel systems on a large scale. Meanwhile, the fixed phase shifter can also be served as a standard digital phase shift circuit when being matched with related single-pole N-throw switches at input and output respectively, and has the advantages of simple design, exact phase shift and high additional amplitude consistency.

The above describes the preferred embodiments of the invention only, and it should be pointed out that the above embodiments are not intended to limit the invention. Various changes and modifications made by those skilled in the art without departing from the scope of the technical concept of the invention shall all fall within the protection scope of the invention.

The invention claimed is:

1. An ultra wide band fixed phase shifter based on capacitive loads, comprising:

N physically separated phase shift units, (N−1) phase shift states being implemented by accessing respective signal input ends and respective signal output ends of different phase shift units, wherein:

each phase shift unit comprises a respective orthocoupler, respective first and second transmission lines, and respective first and second capacitive loads, wherein the corresponding orthocoupler comprises an input end, a coupling end, a direct-connection end and an isolation end, one end of the respective first transmission line serves as the signal input end of the respective phase shift unit and the other end is connected with the input end of the corresponding orthocoupler, one end of the respective second transmission line serves as the signal output end of the respective phase shift unit and the other end is connected with the isolation end of the corresponding orthocoupler;

one end of the first capacitive load is connected with the coupling end of the corresponding orthocoupler and the other end is grounded;

one end of the second capacitive load is connected with the direct-connection end of the corresponding orthocoupler and the other end is grounded, wherein the respective orthocoupler is an ultra wide band orthocoupler cascaded by corresponding spiral inductor coupling units including two or more stages;

each stage of the two or more stages of spiral inductor coupling unit comprises two mutually coupled spiral inductors;

two adjacent stages of the two or more stages of spiral inductor coupling units are respectively connected in series with one of the two mutually coupled spiral inductors in a post-stage of the two or more stages of the spiral inductor coupling units through the two mutually coupled spiral inductors in a prior-stage of the two or more stages of the spiral inductor coupling units to implement a prior-post stage cascade;

one end of one spiral inductor cascaded in a first stage of the two or more stages of the spiral inductor coupling units in the respective orthocoupler and located outside the respective orthocoupler is the coupling end of the respective orthocoupler and one end of the other spiral inductor located outside the respective orthocoupler is the input end of the respective orthocoupler;

one end of one spiral inductor cascaded in a last stage of the two or more stages of the spiral inductor coupling units in the respective orthocoupler and located outside the respective orthocoupler is the direct-connection end of the respective orthocoupler and one end of the other spiral inductor located outside the respective orthocoupler is the isolation end of the respective orthocoupler; and the coupling interval or microstrip band width of each spiral inductor coupling unit in the respective orthocoupler from the exterior of the respective orthocoupler to the interior of the respective orthocoupler decreases gradually.

2. The ultra wide band fixed phase shifter based on capacitive loads according to claim 1, wherein the respective spiral inductor coupling units are mutually coupled by locating the two spiral inductors thereof at the same layer of metal, or the respective spiral inductor coupling units are mutually coupled by locating the two spiral inductors thereof at different layers of metals and upper-lower layer coupling.

3. The ultra wide band fixed phase shifter based on capacitive loads according to claim 1, wherein a respective bridging capacitor is bridged between ports of the two spiral inductors of each spiral inductor coupling unit located at the same side of the orthocoupler, and the two ends of the respective bridging capacitor are respectively grounded through a ground capacitor.

4. The ultra wide band fixed phase shifter based on capacitive loads according to claim 1, wherein a circuit structure of the respective orthocoupler is in bilateral symmetry along a vertical line of symmetry and longitudinal symmetry along a horizontal line of symmetry.

\* \* \* \* \*